United States Patent [19]

Clemens et al.

[11] 4,216,489

[45] Aug. 5, 1980

[54] MOS DYNAMIC MEMORY IN A DIFFUSION CURRENT LIMITED SEMICONDUCTOR STRUCTURE

[75] Inventors: James T. Clemens, Allentown; Dinesh A. Mehta, Bethlehem; James T. Nelson, Coopersburg; Charles W. Pearce, Emmaus; Robert C. Sun, Whitehall, all of Pa.

[73] Assignees: Bell Telephone Laboratories, Incorporated; Western Electric Co., Inc., both of New York, N.Y.

[21] Appl. No.: 5,639

[22] Filed: Jan. 22, 1979

Related U.S. Application Data

[63] Continuation-in-part of Ser. No. 848,000, Nov. 3, 1977, abandoned.

[51] Int. Cl.² .......................................... H01L 27/02
[52] U.S. Cl. .................................. 357/41; 357/23; 357/41; 357/51; 357/89; 357/90
[58] Field of Search ................ 357/23, 41, 46, 51, 357/89, 90

[56] References Cited

U.S. PATENT DOCUMENTS

| | | | |
|---|---|---|---|
| 3,918,081 | 11/1975 | Sangster | 357/23 |
| 3,961,355 | 6/1976 | Abbas et al. | 357/23 |
| 3,997,368 | 12/1976 | Petroff et al. | 357/23 |
| 4,007,478 | 2/1977 | Yagi | 357/23 |
| 4,012,757 | 3/1977 | Koo | 357/23 |
| 4,018,626 | 4/1977 | Schwuttke et al. | 357/23 |
| 4,042,944 | 8/1977 | Yoshida | 357/23 |
| 4,054,989 | 10/1977 | Ho et al. | 357/23 |
| 4,062,699 | 12/1977 | Armstrong | 357/23 |

FOREIGN PATENT DOCUMENTS

2603746 of 0000 Fed. Rep. of Germany ............ 357/23
7831052 of 0000 France ........................................ 357/23

*Primary Examiner*—Edward J. Wojciechowicz
*Attorney, Agent, or Firm*—W. O. Schellin; A. J. Torsiglieri

[57] ABSTRACT

In a dynamic MOS (Metal Oxide Semiconductor) random access memory, reverse bias leakage currents which deplete stored charges are reduced by minimizing minority carrier generation-type currents. By so minimizing these currents, the leakage currents become dominated by minority carrier diffusion currents. The memory is ideally formed in an upper semiconductor layer (14) of a layered structure (11). The semiconductor layer (14) is grown epitaxially with a relatively low dopant concentration on a semiconductor substrate (12) with a dopant concentration of the same conductivity type and about three orders of magnitude greater than that of the epitaxially grown layer. The epitaxially grown structure is advantageously suited for the memory circuits in that it may be formed with very low leakage currents. The material further offers by its layered structure a basis for optimizing dynamic memory device characteristics.

10 Claims, 6 Drawing Figures

MOS DYNAMIC MEMORY IN A DIFFUSION CURRENT LIMITED SEMICONDUCTOR STRUCTURE

CROSS-REFERENCE

This application is a continuation-in-part of co-pending application of Ser. No. 848,000, filed Nov. 3, 1977, now abandoned.

TECHNICAL FIELD

This invention relates to an epitaxial semiconductor device and to making such a device with lower leakage currents compared to similar prior art devices. In its most important application, the invention relates to an MOS memory cell in which a low leakage is achieved to increase the hold time of the information stored in an individual cell.

BACKGROUND OF THE INVENTION

U.S. Pat. No. 4,012,757 to J. T. Koo discloses an MOS random access memory in which data is stored in the form of charges in capacitive memory locations. In such a structure, leakage currents cause the stored charges to decay with time. Consequently, to retain stored data in the memory locations over an extended period of time, periodic readout and refresh pulses become necessary.

Memories subject to these periodic readout and refresh pulses are referred to as dynamic random access memories or dynamic RAMs. While the dynamic RAM device structure is simpler than a static RAM device structure and therefore more desirable, in making such a dynamic RAM it is also desirable to minimize the decay of the stored charges.

A longer decay time amounts to the possibility of slowing down the frequency of the refresh pulses. A longer decay time also decreases the possibility of losing stored data during the interval between two consecutive refresh pulses. Since there is a relationship between the rate of decay of the stored data and the reverse biased junction-type leakage current in the device, it, of course, becomes desirable to reduce this leakage current.

U.S. Pat. No. 3,997,368 to Petroff et al. entitled "Elimination of Stacking Faults in Silicon Devices: A Gettering Process" discloses a reduction of p-n junction leakage currents by suppressing the formation of crystal defects near p-n junctions in semiconductive material through a gettering process. The gettering includes the introduction of lattice distortion by forming a stressed layer on the back surface of the wafer. The layer is then annealed for a time and a temperature effective to cause stacking fault nucleation sites to diffuse to a region near to the back surface of the wafer. The diffusion of the nucleation sites to the vicinity of the back surface suppresses the formation of stacking faults in the device.

Gettering processes similar to those described in U.S. Pat. No. 3,997,368 have been used in the manufacture of typical dynamic memories. For such memories typical hold times have been found to lie in the order of 6 to 40 milliseconds at an 85° C. junction temperature. The term "hold time" refers to the time interval at which refresh pulses can be spaced without losing information from the memory cells.

Of course, for any number of memories tested, hold times vary within a range. By the term "typical" with respect to hold time values it is intended to specify values which divide any number of devices into two substantially equal groups of devices, one group with longer, the other with shorter hold times. It, therefore, appears desirable to manufacture dynamic memories with typical hold times well above minimum hold time requirement. To obtain an acceptable yield of manufactured memory devices, it is desirable to have substantially all such devices meet the minimum hold time requirements.

It has been recognized, for instance, by the aforementioned U.S. Pat. No. 4,012,757 to J. T. Koo that MOS random access memories can be made in a semiconductive body which comprises a substrate portion on which there has been grown an epitaxial layer in which the active cells of the memory are formed. However, there are no such known memories which have become commercial. This is believed to be the case because hitherto any reasonably expected benefits of such a structure could not outweigh added process complexity and expense of the addition of an epitaxial layer to bulk silicon.

SUMMARY OF THE INVENTION

We have found that reverse-bias leakage currents in semiconductor circuits, such as MOS dynamic random access memories, can be suppressed when the circuits become diffusion current dominated at normal operating temperatures. It then becomes possible to limit the availability of minority carriers which diffuse through the material and across reverse biased junctions without deleterious effects on desirable junction characteristics.

In accordance with the invention, a semiconductor device with desirably low reverse-bias leakage current characteristics across p-n junctions includes a single crystal silicon body. The body includes a relatively heavily doped bulk or substrate portion (e.g., more than $10^{18}$ p-type dopants per cubic centimeter). On the substrate portion there is formed an epitaxial layer of substantially less dopant concentration (e.g., typically $2 \times 10^{15}$ p-type dopants per cubic centimeter). The epitaxial layer has a thickness of a fraction of the diffusion length of the minority carriers in the layered structure.

The layered structure is typically prepared so that its minority carriers have an average lifetime of about 500 microseconds, and that is estimated to result in a diffusion length of about 500 microns ($500 \times 10^{-6}$ meters). The epitaxial layer is made to have a thickness of less than about 15 microns. Furthermore, the quality of the epitaxial layer with respect to minority carrier generation centers is such that the number of such centers is so small that a diode formed in the epitaxial layer is substantially diffusion current dominated within normal operating temperatures of circuit devices in the body.

It is found that a p-n junction entirely formed in such a epitaxial layer will have a very low reverse leakage current. Accordingly, a dynamic random access memory cell formed in the epitaxial layer is provided with a surprisingly long hold time, well worth the extra processing effort involved. Moreover, if p-n junctions of such a cell are confined to a region close to the surface of the layer and entirely within the thickness of the layer, breakdown characteristics and capacitance of such junctions remain substantially those typically corresponding to the more lightly doped layer rather than those associated with the dopant concentrations in the substrate portion of the body.

BRIEF DESCRIPTION OF THE DRAWING

The various features and advantages of the invention can be more easily understood from the following detailed description taken in conjunction with the accompanying drawing in which.

DETAILED DESCRIPTION

General Considerations

The present invention is particularly useful with respect to MOS dynamic RAMs. It is with respect to this type of semiconductor device that the present invention will be described. However, this does not mean that the invention does not have broader applicability. In general, the invention applies to various semiconductor elements which require the leakage current through reverse biased p-n junctions to remain comparatively low.

Prior art n-channel dynamic RAMs have been made by conventional manufacturing techniques at one surface of a p-type doped silicon wafer. It is known, for instance, that there is a correlation between the lifetime of minority carriers in the semiconductor material and the ultimate hold times of the memory cells being formed at the one surface of the semiconductor wafer. For instance, for a prior art memory circuit structure, minority carrier lifetimes in the bulk silicon material of 10 to 50 microseconds corresponded approximately to typical hold times in the finished memories of two to ten milliseconds. The manufacturing steps for making such prior art memory included gettering steps similar to those disclosed in U.S. Pat. No. 3,997,368.

We have now discovered that a semiconductor structure is possible which results in a distinct, step-like, increase in hold times of memory cells of a dynamic RAM. However, this increase appears to be achievable only when the semiconductor material in which the memory cells are located is of a quality to limit any reverse leakage currents to what is known as the "diffusion component" of the currents.

The desired "quality" or crystalline structural integrity is one of the lowest level of contaminants or harmful impurities that is obtainable with present manufacturing techniques and equipment. These harmful impurities include, for instance, such elements as iron, nickel, copper, calcium or gold. The harmful impurities for purposes of this invention are those which have an energy level about halfway between the valence and the conduction band of silicon. They, consequently, provide by their presence in the crystal lattice generation centers for minority carriers. Also, they are believed to be a cause in the formation of stacking faults and other crystal defects which are known to increase reverse leakage currents when they occur in the vicinity of p-n junctions.

In the absence of such harmful impurities, it appears that the diffusion of minority carriers, e.g., electrons in p-type material, becomes the controlling mechanism by which reverse leakage currents can occur. This environment, namely, a predominantly diffusion current dominated semiconductor structure within the temperature operating range of a device formed therein is a significant aspect of this invention.

Minority carrier diffusion currents are found to be highly temperature dependent. And a sharp increase in reverse leakage currents across diode junctions has been looked upon in the past as a high temperature phenomenon. The change in the temperature dependence of the reverse leakage current appears to be the crossover from a generation current dominated to a diffusion current dominated leakage current as the temperature of a device in question is increased.

However, when a device is made in accordance with this invention the reverse bias leakage current of its p-n junctions desirably shows the temperature dependence of the diffusion current mechanism in the high temperature portion of its contemplated operational temperature range. The operational temperatures can range from normal room temperature to in excess of 90° C. When reference is made to the high portion of the temperature range temperatures normally higher than 70° C. are meant. A typical high portion of temperatures ranges from 70° C. to 90° C. However, in pure crystalline structures the reverse bias leakage current may already be dominated by diffusion currents at temperatures above 40° C. Such a diffusion current dominated structure requires that the harmful impurities be substantially eliminated from the structure in which the device is formed.

A preferred embodiment of the invention is a dynamic n-channel random access memory device which is incorporated into a p-type epitaxial silicon body. The body includes a substrate or bulk portion which is preferably boron-doped (boron is a p-type dopant) to a relatively high concentration, preferably $10^{19}$ atoms of the dopant per cubic centimeter. On the bulk silicon there is formed an epitaxial layer, also of boron-doped silicon. However, in the preferred embodiment, the epitaxial layer is doped only to a concentration of about $2 \times 10^{15}$ dopant atoms per cubic centimeters. It is in this epitaxial layer that memory cell elements are formed.

We have found that the described epitaxial device structure is diffusion current dominated, and junction characteristics, such as capacitance and breakdown voltage, of the memory cell elements are determined by the doping level in the epitaxial layer. On the other hand, the reverse leakage currents across junctions in the elements are limited by the reduced availability of the minority carriers, e.g., electrons, within one diffusion length from the junction, in the highly doped substrate. A memory in such structure consequently has optimum capacitance, threshold and breakdown voltage characteristics, and in addition low reverse leakage characteristics which translate into advantageously long hold times for each of the individual cells in the memory.

However, the advantageous results of the described structure disappear when the level of harmful impurities is such that the device, e.g., the memory in the epitaxial layer, is significantly controlled in its reverse leakage current characteristics by minority carriers generated in the vicinity of the junctions.

It becomes, therefore, important to form the memory in material having the described "quality", e.g., a level of harmful impurities which is so low, that the impurity level is difficult to measure, even with present day techniques. It appears, however, that the advantages of the structure compound each other in that the structure appears to have characteristics which tend to getter the harmful impurities to the bulk silicon, so that the epitaxial material tends to have a desirably low level of such harmful impurities.

The Semiconductor Body

Figure 1:
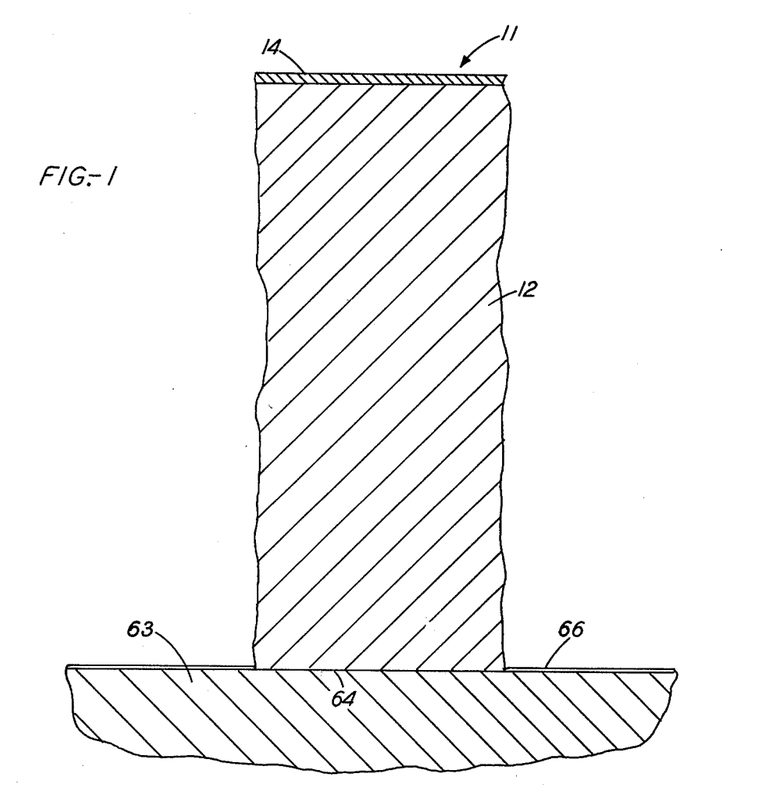
FIG. 1 is a cross section through a portion of a semiconductor wafer showing an epitaxial layer on a substrate in proportional thickness to the substrate, useful to explain the invention.

In FIG. 1 there is shown a portion of a semiconductor wafer which is designated generally by the numeral 11. The wafer 11 is shown in cross section to show the relative thickness between the substrate or bulk portion 12 of the wafer 11 and an epitaxial layer 14 which is formed at one surface of the wafer. The bulk silicon 12 has a thickness of approximately 20 mils or 500 microns ($500 \times 10^{-6}$ meters).

In comparison to the bulk silicon 12, the thickness of the epitaxial layer is preferably only ten to fifteen microns. Consequently, FIG. 1 shows on a greatly enlarged scale the approximate proportions of the thickness of the bulk silicon to the epitaxial thickness of the wafer 11.

The starting bulk material 12 of the wafer 11 is a p+ type silicon material with a (100) crystal orientation. The p+ type doping is a boron doping at a level of at least $10^{18}$ atoms per cubic centimeter. The doping level for the starting material of at least $10^{18}$ boron atoms per cubic centimeters was found to be a threshold limit to take full advantage of the invention in relationship to the doping of the epitaxial layer 14. When the bulk silicon 12 was doped to at least such a level, the epitaxial layer 14 could be grown with unmeasurably low concentrations of these harmful impurities, such as iron, nickel, copper, calcium or gold.

On the other hand, when the boron doping level dropped below $10^{18}$ atoms per cubic centimeters, the epitaxial layer was found to show signs of increasingly higher concentrations of the harmful impurities. The higher concentrations of the harmful impurities resulted in correspondingly shorter effective lifetimes of minority carriers. Consequently, it may be possible in a very clean process with virtually no introduction of any of the harmful impurities into the semiconductor structure to achieve the same high effective lifetime characteristics even with a lower doping level than $10^{18}$ atoms per cubic centimeter in the substrate.

In a preferred embodiment, the boron concentration in the bulk section 12 is consequently about $10^{19}$ atoms per cubic centimeter. It is believed that at this doping level in the process described, the bulk silicon acts as a barrier to, or a trap for, the harmful impurities diffusing through the wafer 11.

The highly doped bulk silicon appears to exhibit an increased capacity to trap any of the harmful impurities. An explanation for such an increased capacity to trap impurities is not proven. However, some theories are offered which may give some insight.

One mechanism of such a barrier may be the result of possible ionic bonds between the harmful impurities and other atoms in the doped crystalline semiconductor structure. Such bonds are believed to account for at least in part the retention of the harmful impurities within the bulk silicon 12 as they diffuse throughout the structure. However, such ionic bonding by which the impurities tend to be retained within the highly doped structure of the bulk silicon may be the only one of several mechanisms to result in gettering of harmful impurities.

Another mechanism is believed to involve lattice strain which has been detected at the interface between the bulk silicon 12 and the epitaxial layer 14. The strain is the result of the different doping levels in the bulk silicon 12 and the epitaxial layer 14. The different doping levels establish differences in the lattice spacing of the bulk silicon 12 and of the epitaxial layer 14 which result in lattice strain misfit dislocations. These misfit dislocations are believed to contribute to the trapping or gettering of the harmful impurities from the epitaxial layer 14.

Gettering as a result of misfit dislocations introduced on one surface of a wafer is known. U.S. Pat. No. 3,997,368 to Petroff et al. discloses such a means for gettering impurity. However, in the wafer structure according to the present invention, the plane of the misfit dislocations is located at the interface between the bulk silicon 12 and the epitaxial layer 14. The proximity of the misfit dislocations to the active p-n junctions in the epitaxial layer 14 is believed to enhance their effectiveness in gettering throughout all heated processing steps. This enhancement is believed to exist in comparison to the back surface gettering process disclosed in U.S. Pat. No. 3,997,368. It should be understood, however, that the invention is not predicated on any of the mechanisms or theories discussed herein. These theories are merely offered as possible explanations to the results.

With such an observed increased capacity to retain the harmful impurities in the bulk silicon once they enter the wafer, and with various precautions to prevent the harmful impurities from diffusing into the wafer 11 during the process of making the semiconductor devices, the epitaxial layer 14 becomes relatively free of such impurities. Consequently, the layered structure or wafer 11 exhibits relatively long minority carrier lifetime characteristics.

The epitaxial layer is grown to have a doping level of about $2 \times 10^{15}$ boron atoms per cubic centimeter. The doping level determines, for instance, the capacitance of any junctions in the material.

Typically, at the interface between the epitaxial layer and the original substrate there will be a region of graded concentration resulting from the outdiffusion of boron from the substrate into the epitaxial layer during growth of the epitaxial layer. However, in an epitaxial layer of a thickness about 10–15 microns, as it typical of the preferred embodiment, this effect is negligible.

The layered structure so formed, including the bulk silicon substrate and the epitaxial layer 14, typically is found to have an effective electron lifetime of at least 500 microseconds. Such a value corresponds to a diffusion length for the minority carriers, namely, the electrons, estimated to be of about 500 microns. The thickness of the epitaxial layer 14 is consequently no more than one-thirtieth of the effective diffusion length of the electrons in the layered structure.

Thus, in a defect free epitaxial layer, the measured generation lifetimes reflect the diffusion current-limited attributes of the layered structure. However, at the same time, the junction is embedded in a finite thickness of the lightly doped material. It is this lightly doped material that determines good breakdown characteristics and low capacitance of MOS elements in the layer. In particular, it is desirable that the thickness of the epitaxial layer be about equal to the depth of the n-type regions plus the thickness of the depletion layer associated with the n-type regions when the maximum operating voltages are established on such regions.

With such a thickness, it will be appreciated that within a volume of material from which free electrons can be expected to diffuse across an adjacent rectifying junction as the effective leakage current of such junction, the effective material is according to this invention, largely the heavily doped material of the substrate. In this heavily doped bulk p-type silicon the free electrons are few in comparison to the lightly doped p-type epitaxial layer where the free electrons, being adversely proportional to the doping level, are more plentiful.

If the epitaxial layer is thicker, the number of minority carriers in the epitaxial layer is increased and the leakage current is thereby undesirably increased. Additionally there is increased undesirably the resistance in the vertical plane of the structure. On the other hand, if the epitaxial layer is thinner than the depletion layer, the capacitance of the junctions associated with the n- regions is increased and the breakdown voltage is correspondingly undesirably decreased. In particular, the lower the operation voltages, the thinner the depletion layer and the thinner the optimum thickness for the epitaxial layer.

As indicated above, for operation with an expected maximum reverse dynamic operating voltage of about 22 volts, we have found it to be preferable to start with an epitaxial layer of thickness of about 10–15 microns. Of course, with lower operating voltages even thinner layers become optimum.

The Device Structure

Figure 2:
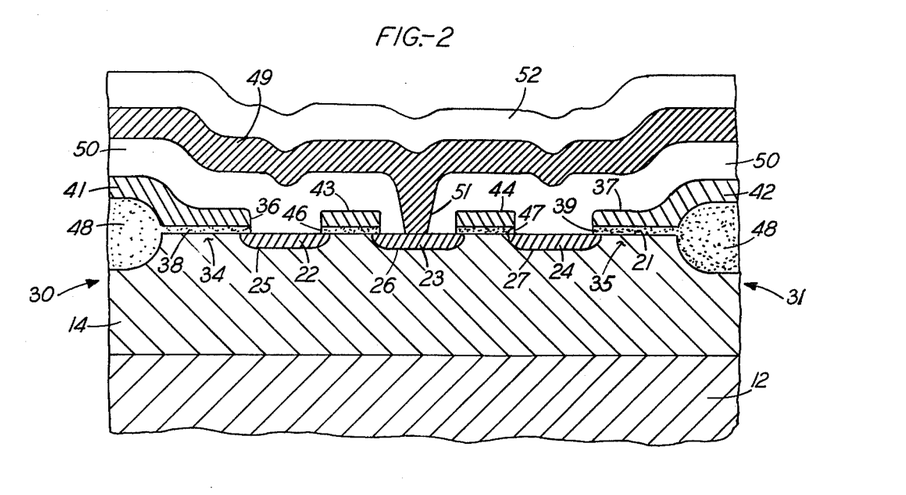
FIG. 2 is an enlarged view of the epitaxial portion shown in FIG. 1 and depicting various doped regions for forming p-n junctions having low leakage current in accordance with the invention.

Referring now to FIG. 2, there is shown on an enlarged scale a portion of the epitaxial layer 14 with a portion of the adjacent bulk silicon 12. Into the epitaxial layer 14, regions of opposite, donor or n-type impurities such as phosphorus or arsenic atoms are imbedded to a relatively shallow depth (approx. 0.5 to 2 microns).

Figure 3:
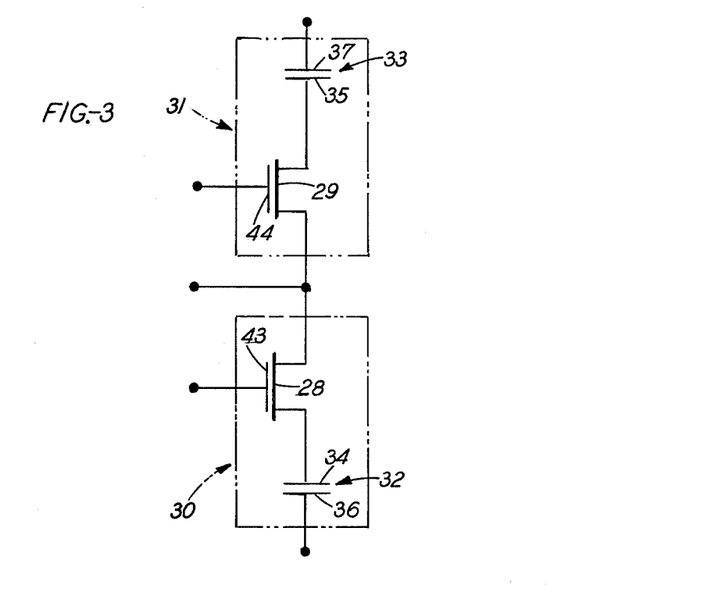
FIG. 3 is a schematic diagram of the electrical function of the structure of FIG. 2.

The selective predominance of the n-type impurities forms n-type regions 22, 23 and 24 at the surface of the epitaxial layer 14 and results in p-n junctions 25, 26 and 27, respectively. Selectively patterned oxide layers and additional conductive patterns deposited over oxide dielectric layers form active MOS devices of the n-channel dynamic RAM described herein. In particular, there are shown transistors 28 and 29 (FIG. 3). These devices and their interconnecting structures can be formed in accordance with known processing steps. It is important to notice, however, that none of the active MOS structures including the p-n junctions extend beyond regions close to the upper surface of the epitaxial silicon layer. The entire device structure of each memory cell is located near the upper surface of the epitaxial layer 14.

In fact, an optimum thickness for the epitaxial layer 14 is one which exceeds only slightly the depth of the p-n junction from the upper surface of the layer added to the expected depth of the depletion region about the juction. The determination of the depth of the depletion region is well known in the art. It depends, of course, on the doping of the semiconductor material, e.g., that of the epitaxial layer 14, and the maximum reverse bias voltage to be applied to the junction. In the preferred embodiment a typical reverse voltage is the sum of a negative 5 volt bias voltage applied to the substrate and positive dynamic operating voltages from a positive twelve volt power supply. The dynamic behavior of the applied operating voltages can amount to maximum reverse bias voltages of about 22 volts across anyone of the junctions. In this dynamic environment the thickness of the layer 14 still permits the junction to possess the characteristics of the lightly doped layer 14, while it maximizes at the same time the influence of the bulk silicon with its greatly reduced number of free electrons.

The transistors 28 and 29 belong to two adjacent memory cells which are designated generally by the numerals 30 and 31 in FIG. 3. Another element of each of the cells 30 and 31 is a capacitor, 32 and 33 respectively.

A plate 34 (see also FIG. 2) of the capacitor 32 is part of the epitaxial layer 14. Similarly, a plate 35 of the capacitor 33 is the epitaxial silicon adjacent the region 24. Facing plates 36 and 37 of the respective capacitors 32 and 33 are spaced from the epitaxial layer 14 by thin silicon oxide films 38 and 39.

The plates 36 and 37 are preferably formed of polycrystalline silicon with connecting extensions 41 and 42 to a common constant voltage plane. Gate 43 and 44 of the transistors 26 and 27 are also formed of polycrystalline silicon. The gates 43 and 44 are also, like the plates 36 and 37, separated from the epitaxial silicon by thin films 46 and 47 of silicon oxide.

The thickness of the thin films 38, 39, 46 and 47 are chosen to lie in a range from about 200 Angstrom units to 2000 Angstrom units. Typically, about 900 Angstrom units are presently preferred. The thickness of such thin films of oxide are consequently only about one-tenth of the thickness of thicker field oxide layers 48, which are preferred to lie in the range of 1 micron. The junction depths of the n-type diffusions are in comparison also about 0.8 microns below the upper surface of the epitaxial layer 14.

The gates 43 and 44 integrally form word select lines which extend perpendicular to the section of FIG. 2. The extensions 41 and 42 continue to lead away from the memory cells 30 and 31 separated from the epitaxial layer 14 by the field oxide layers 48.

A second level metallization pattern 49, preferably of aluminum, is separated from the gates and capacitor plates by an interlevel dielectric layer 50. Selective openings 51 in the layer 50 permit the pattern 49 to contact the region 23. As can be seen in FIG. 2, through each opening two memory cells (30 and 31) are contacted. Conductors of the pattern 49 form bit sense lines of the memory device. As is conventional in the art, application of appropriate voltages to the gate electrodes 43 and 44 effectively establishes a path between the adjacent n-type regions to enable the coupling of signals from the bit sense lines 49 to the capacitors 32 or 33. The upper surface of the cells 30 and 31 is passivated by a top dielectric layer 52.

Figure 4:
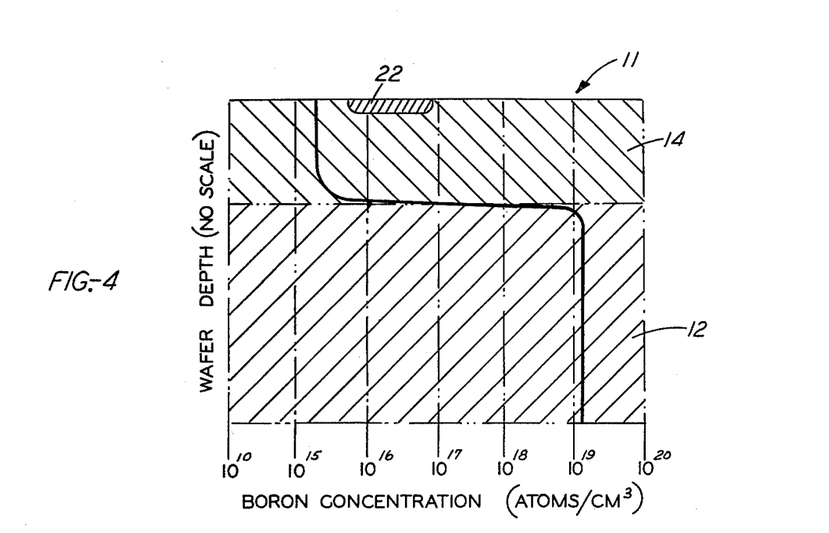
FIG. 4 is a diagram of preferred boron concentrations in the semiconductor material of the wafer of FIG. 1.

FIG. 4 shows a typical concentration profile in the epitaxial layer 14, the bulk silicon 12 and in the interfacing region between the epitaxial layer and the bulk silicon. As the epitaxial layer 14 is grown on the top of highly doped silicon, some out-diffusion of boron dopants from the bulk silicon is encountered. The boron diffuses into the epitaxial layer, however, the rate of growth of the epitaxial layer exceeds that of the out-diffusion of boron from the bulk silicon. Consequently, the boron concentration in the epitaxial layer quickly settles to the desired value of approximately $2\times10^{15}$ atoms per cubic centimeter of boron. Comparing the dopant concentration profile with an overlay portion of the wafer 11, including one of the highly doped n-type regions for reference, it is seen that the active regions and p-n junctions are formed entirely within silicon having a uniform dopant concentration.

Figure 5:
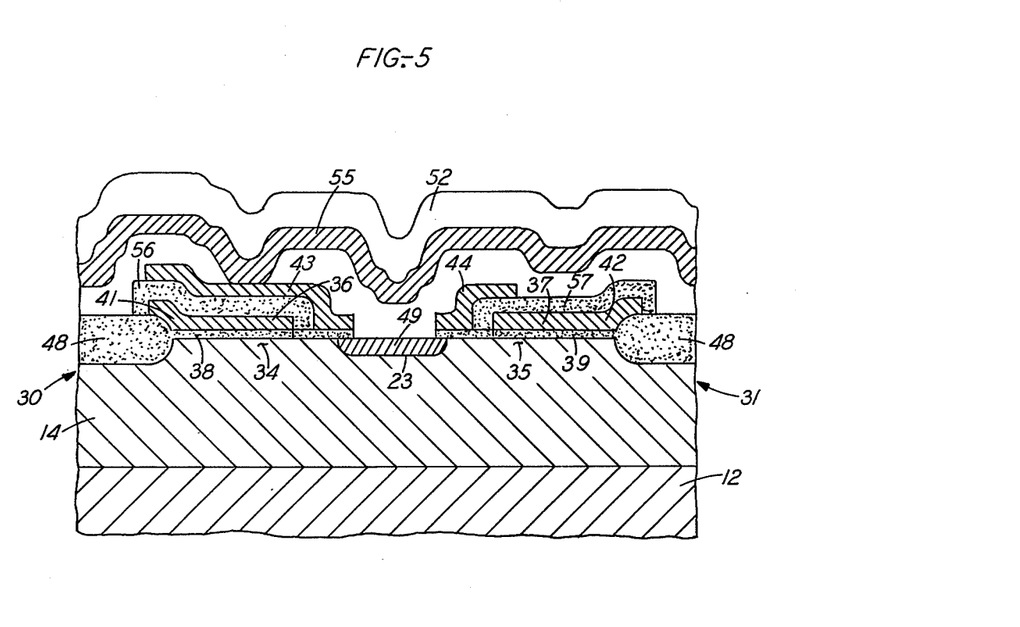
FIG. 5 is an alternate and presently preferred structure to which the invention is applicable to obtain favorable reverse leakage current characteristics.

FIG. 5 refers to an alternate memory to which the invention preferably applies. The previously referred-to U.S. Pat. No. 4,012,757 to J. T. Koo discloses, for instance, a merged drain and capacitor region. FIG. 5 also discloses an embodiment of a memory with a merged drain and capacitor region (34 or 35). As in the Koo patent, such a device is operated with a bias on the plates 36 and 37 with respect to the substrate 12 sufficient to invert the underlying regions 34 and 35 whereby each such region serves both as a virtual drain of the respective access transistor and as the respective plate of the storage capacitor 32 or 33. Such an embodiment tends to save space in the layout of the memory cells (30 and 31). It appears that larger memories, e.g., 16,384 bits compared to 4,096 bits, are particularly advantageously affected by the present invention, when the physical design of the cells with reduced storage capacitance, for instance, results in reduced hold times. The embodiment of FIG. 5 represents such a memory. Numerals pointing out similar functional elements have been kept the same as in FIGS. 2 and 3.

However, the section of FIG. 5 through the two memory cells 30 and 31 differs from the section in FIG. 2 because of an offset layout of the adjacent cells 30 and 31. Also, the region 23, an arsenic implant, is extended perpendicular to the plane of the section to function as the bit select line 49. The gates 43 and 44 are formed of polycrystalline silicon, but their common extension of a word select line 55 is now formed of aluminum. The contact of the word select line 55 with the gate 44 is not shown since it exists in an offset position from the plane of the section. The respective capacitor plates 36 and 37 extend perpendicularly to the section by the extensions 41 and 42 to the common constant voltage source. Interlevel dielectric layers 56 and 57 separate the capacitor plates 36 and 37 from the adjacent gate conductors 43 and 44, respectively.

The mode of operation of memory structures similar to the ones disclosed herein is well known in the art. The increase in the hold times of the cells appears as distinct departure when the described memory structure can operate in a diffusion current controlled structure. In this mode leakage currents become inversely proportional to the concentration of the dopants in the semiconductor material in which the junctions of interest are located.

Eliminating Harmful Impurities

It has been found that the capacity of the highly doped bulk silicon 12 to trap the harmful inpurities, while improved over less highly doped material is, nevertheless, limited.

It is, therefore, desirable to minimize ab initio the level of the harmful impurities which enter the silicon wafer 11. During the process of growing the epitaxial layer 14, the harmful impurities enter the system through contaminated gases. However, the level of the harmful impurities entering from contacting gases is low. Generally, the contacting gases are sufficiently pure that they can mostly be disregarded as a substantial source of contaminants or harmful impurities.

However, a more significant possible source of harmful impurities has been discovered. It has been found that while the wafers 11 are being heated for the deposition of the epitaxial layer 14 impurities may readily migrate from a susceptor 63 through an interface 64 between the wafer 11 and the susceptor 63. It becomes, therefore, desirable to eliminate the in-diffusion of the harmful impurities from the susceptor 63. It has, for instance, been found that some type of susceptors are more apt to contain the harmful impurities than others.

Susceptors which have been found to be particularly advantageous are made of pyrolytic graphite. Impurity levels in pyrolytic graphite susceptors were sufficiently low to permit their use to result in typical lifetimes in the layered structure of more than 500 microseconds.

The transfer of the harmful impurities from the susceptor 63 to the wafers 11 is furthered by direct contact between the wafers 11 and the susceptor 63 during the growing of the epitaxial layer 14 on each of the wafers 11.

Prior to growing the epitaxial layer 14 with the desired boron concentration of $2\times10^{15}$ atoms per cubic centimeter, auto-doping advantageously should be limited. Auto-doping is a phenomenon by which the epitaxial layer 14 accepts dopants from the bulk silicon through the gaseous environment of the wafers 11. The boron elements out-diffuse form the bulk silicon into the gaseous atmosphere of the reactor and then redeposit in the crystalline structure of the epitaxial layer 14 of each of the wafers.

To control out-diffusion of boron dopants from the bulk silicon 12, a layer 66 of highly pure polycrystalline silicon advantageously is deposited on the surface of the susceptor 63 to a thickness of approximately two to three microns. The wafers 11 are then supported on the surface of the coated susceptor 63

Figure 6:
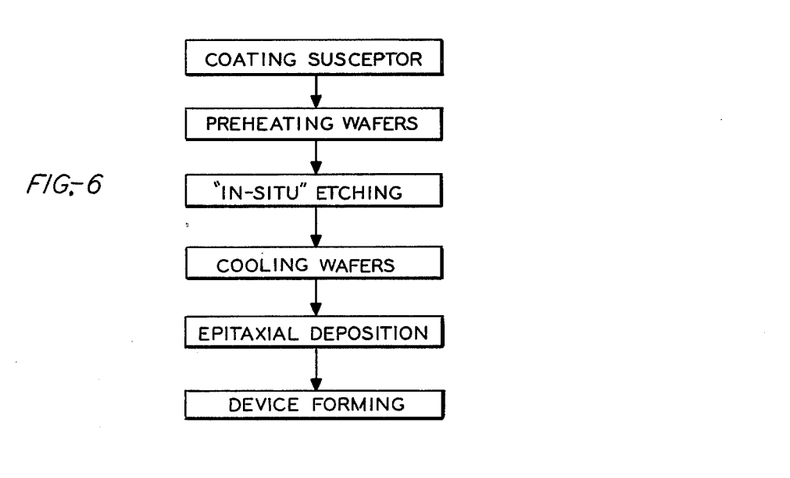
FIG. 6 is a block diagram of a process highlighting steps of forming a semiconductor device in accordance with a preferred embodiment of the invention.

In reference to FIG. 6, the wafers 11 are then heated to a temperature of approximately 1100° C. in a hydrogen atmosphere. At this temperature boron tends to evaporate from the wafer surface and hydrochloric acid is then injected in gaseous form for a time interval of five minutes during which approximately 0.5 micron of the silicon material is etched from its surface. The etching velocity proceeds much more rapidly than the evaporation of boron atoms from the silicon. The "in-situ" etching step is done for perfection. Our experience has been that without the etching step, a great number of defects occur in the epitaxial layer.

While the wafers remain on the susceptor in the reactor the temperature is lowered slightly to approximately 1040° C. during a time span of approximately one to two minutes. After that time a dichlorosilane process of growing the epitaxial layer 14 is started. The main carrier gas is hydrogen wih dopant gases introduced in very low quantities. It is desirable to adjust the quantities to achieve precise doping levels in the epitaxial layers. Even under ideal conditions out-diffusion from the highly doped bulk silicon 12 has some effect on the dopant level of the epitaxial layer.

Further processing steps pertain to the forming of the MOS memory cells 30 and 31 in the epitaxial layer 14. In the epitaxial layer 14, the regions 22, 23 and 24 of opposite conductivity type are formed either by diffusion or by ion implanation techniques. Selectivity in exposing designated areas of the surface of the epitaxial layer 14 to dopants of the opposite conductivity type is achieved by selective oxide masking in accordance with known techniques. Further steps include thin oxide forming and deposition and definition of the polycrystalline silicon. Interlevel dielectric layers are formed, followed by aluminum deposition for the bit sense lines. These processing steps can be executed in accordance with techniques well known in the art.

During these processing steps, harmful impurities may be introduced at various levels either through rinsing waters or through handling into the top surface of the wafer 11. A final open window phosphorus gettering step is therefore done prior to forming metallization patterns. However, continuous gettering of harmful impurities by the heavily doped bulk silicon 14 is believed to take place throughout the various device forming steps to minimize crystalline defects in the active areas of the epitaxial layer 14 as the devices are being formed at its surface.

In the completion of MOS memories in accordance with the present invention, the exclusion of sources of harmful impurities during the various processing steps is of continuous concern. It must, however, be recognized that in a substantially clean environment active exclusion of such impurities becomes of lesser concern. This is particularly true in view of the impurity trapping mechanism established.

Consequently, various changes in the process and structures described herein can be made without departing from the scope and spirit of the present invention.

What is claimed is:

1. An n-channel random access memory device which comprises:
   a silicon layered structure which includes a p-type substrate portion of relatively high concentration of its predominant dopant and on one surface thereof a p-type epitaxial layer of relatively lower concentration of its prodominant dopant, the epitaxial layer being substantially free of minority carrier-generating harmful impurities and of a thickness which is no more than one-thirtieth the value of the diffusion length of electrons in the layered structure, the layered structure being of a quality that the diffusion length is at least about 500 microns;
   a plurality of spaced n-type regions at the upper surface of the epitaxial layer and of a depth to be entirely enclosed within the epitaxial layer, said n-type regions forming transistor terminals, each terminal forming an n-p junction with the material of the epitaxial layer;
   dielectric material overlying the free surface of the epitaxial layer;
   conductive portions overlying selected areas of the dielectric material for forming capacitor plates in superposition to regions of the epitaxial layer, said regions forming capacitors being capable of becoming charged upon the application of a signal to a respective one of said n-type regions forming one of the terminals; and
   conductive patterned material overlying the dielectric material spaced from and adjacent to said conductive portions and having further portions overlying dielectric material for forming gate electrodes of said transistors, said gate electrodes capable of selectively enabling signals applied to said terminals to be coupled to said capacitors, thereby enabling said signals to cause charges to be stored in respective ones of the capacitors, a decay of said stored charges being substantially limited by the epitaxial layer being substantially free of the harmful impurities and by the proximity of the substrate of relatively high concentration of its predominant dopant limiting the availability charge decaying electrons.

2. A memory in accordance with claim 1 in which the concentration of predominant dopant in the epitaxial layer is at least one hundred times less than that in the substrate.

3. An n-channel random access memory device which comprises:
   a silicon layered structure including a substrate doped to a concentration of at least $10^{18}$ p-type dopant atoms per cubic centimeter, and an epitaxial layer of silicon on the substrate doped to a concentration in the range of $10^{14}$ to $10^{16}$ p-type dopant atoms per cubic centimeter, the layer being substantially free of harmful impurities;
   a plurality of memory circuits located at the surface of the layer, the circuits including spaced n-type regions at the upper surface of the layer and extending in depth from such surface into the layer and forming junctions with the layer, the layer having a thickness which is limited to include the depth of the junctions and to enclose substantially no more than the thickness of a depletion region in the layer when the junctions are reverse-biased with operating voltages;
   dielectric material overlying the upper surface of the layer; and
   conductive material overlying the dielectric material in a pattern forming connections and components of the memory circuits, portions of said pattern overlying the material to form gate electrodes and further portions forming capacitor plates opposite p-type regions of the layer, said p-type regions of the layer forming capacitors in combination with said oppositely located plates, said gate electrodes capable of selectively enabling signals from the n-type regions to be coupled to the capacitors, said coupled signals thereby causing the storing of positive charges in said capacitors, the decay of said stored charges being delayed by the layer substantially free of harmful impurities and by the substrate limiting the availability of free electrons.

4. An n-channel random access memory device according to claim 3, wherein the reverse bias leakage current of the junction is dominated by the diffusion of minority carriers at temperatures above 70° C.

5. An n-channel random access memory device according to claim 3, wherein the reverse bias leakage current of the junctions is dominated by the diffusion of minority carriers at temperatures above 50° C.

6. A semiconductor device which comprises:
   a silicon layered structure which includes a p-type substrate of relatively high concentration of its predominant dopant and on one surface thereof a p-type epitaxial layer of relatively lower concentration of its predominant dopant, the layer being substantially free of harmful impurities having energy levels which lie in a range halfway between the valence and the conduction bands of silicon, the layer having a thickness which is no more than one-thirtieth the value of the diffusion length of electrons in the layered structure, the layered structure being of a quality that the diffusion length is at least about 500 microns; and
   a plurality of spaced n-type regions at the upper surface of the layer and of a depth to be entirely enclosed within the epitaxial layer the regions forming junctions with the layer, the junctions being capable of becoming reverse biased by an application of operating voltages to the regions, said reverse biased junctions having reverse leakage current characteristics limited by the layer being substantially free of such harmful impurities and by the proximity of the substrate, the relatively high concentration of the predominant dopant of the substrate limiting the availability of free electrons to diffuse across the junctions.

7. A semiconductor device which comprises:

a silicon layered structure including a substrate portion doped to a concentration of a least $10^{18}$ p-type dopant atoms per cubic centimeter, and an epitaxial layer of silicon on the substrate portion doped to a concentration in the range of $10^{14}$ to $10^{16}$ p-type dopant atoms per cubic centimeter, the layer being substantially free of harmful impurities;

a plurality of spaced n-type regions at the upper surface of the layer and extending in depth from such surface into the layer and forming junctions with the layer, the junctions, upon becoming reverse biased, being capable of blocking a positive charge applied to the regions from being transmitted to the layer except for a reverse leakage current limited by the layer being substantially free of harmful impurities, the layer having a thickness which is limited to include the depth of the junctions and to enclose substantially no more than the thickness of a depletion region in the layer when the junctions are fully reverse-biased;

dielectric material overlying the upper surface of the epitaxial layer; and a conductive pattern located on the dielectric material.

8. An n-channel random access memory device of the type which includes a plurality of memory cells formed at a surface of a semiconductor body, each cell including a capacitor for storing a data pulse and a transistor for selectively admitting to and retrieving from the capacitor such data pulse, the capacitor including a selected p-type region within the body, a dielectric layer and a conductive plate material overlying the dielectric layer, the transistor including at least one n-type region formed within and at the surface of the body and a gate electrode spaced from the body by a dielectric layer and located adjacent and electrically between the n-type region and the p-type capacitor region, characterized in that:

the n-type region and said selected region are located in an epitaxial layer of silicon doped to a concentration in the range of $10^{14}$ to $10^{16}$ p-type dopant atoms per cubic centimeter; and the epitaxial layer is formed on a silicon substrate doped to a concentration of at least $10^{18}$ p-type dopant atoms per cubic centimeter, the epitaxial layer being substantially free of harmful impurities.

9. An n-channel random access memory device according to claim 8, in which the epitaxial layer is less than 15 microns thick.

10. An n-channel random access memory according to claim 9, further characterized in that the selected capacitor region is adapted to be inverted by a bias during operation.

* * * * *